(12) United States Patent
Han

(10) Patent No.: US 8,710,636 B1
(45) Date of Patent: Apr. 29, 2014

(54) LEAD FRAME ARRAY PACKAGE WITH FLIP CHIP DIE ATTACH

(71) Applicant: Caleb C. Han, Phoenix, AZ (US)

(72) Inventor: Caleb C. Han, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/758,263

(22) Filed: Feb. 4, 2013

(51) Int. Cl.
*H01L 23/495* (2006.01)

(52) U.S. Cl.
USPC ............................. 257/670; 257/666

(58) Field of Classification Search
USPC ......................... 257/666, 670, 676
See application file for complete search history.

(56) References Cited

U.S. PATENT DOCUMENTS

| | | | |
|---|---|---|---|
| 6,392,288 B1* | 5/2002 | Tan et al. | 257/670 |
| 7,279,780 B2 | 10/2007 | Fee et al. | |
| 8,039,933 B2 | 10/2011 | Hsieh et al. | |
| 8,071,427 B2* | 12/2011 | Celaya et al. | 438/112 |
| 2003/0102537 A1* | 6/2003 | McLellan et al. | 257/666 |
| 2003/0155634 A1* | 8/2003 | Yasunaga et al. | 257/666 |
| 2013/0249546 A1* | 9/2013 | David et al. | 324/260 |

* cited by examiner

*Primary Examiner* — S. V. Clark
(74) *Attorney, Agent, or Firm* — Jonathan N. Geld

(57) ABSTRACT

A small form factor near chip scale package is provided that includes input/output contacts not only along the periphery of the package, but also along the package bottom area. Embodiments provide these additional contacts through use of an array lead frame coupled to under die signal contacts through the use of flip chip bonding techniques. The array lead frame contacts are electrically isolated through the use of a partial sawing process performed during package singulation.

9 Claims, 8 Drawing Sheets

LEAD FRAME ARRAY PACKAGE WITH FLIP CHIP DIE ATTACH

BACKGROUND

1. Field

This disclosure relates generally to semiconductor device packaging, and more specifically, to providing sufficient input/output contacts on small form-factor packages.

2. Related Art

Smaller electronic devices and demands for increased functionality of electronic circuits in the same space create the need for near chip scale packages. One type of near chip scale package is the flat no-leads package, such as dual-flat no-leads (DFN) and quad-flat no-leads (QFN) packages. Flat no-leads packages provide a semiconductor device encapsulated in a molding material and coupled to the input/output contacts, or lands, on the perimeter of the device package through a lead frame substrate.

Continued demands for smaller package footprints have resulted in decreasing package sizes, in some cases to 2 mm×2 mm or less. At these scales, contact pitch limitations restrict the number of contacts that can be provided along the perimeter of the package. In addition, demand for increased functionality in these small packages makes it desirable for larger semiconductor devices to be incorporated in the package. But traditional flat no-leads packaging techniques require wire bonding of die contacts to the lead frame, which takes up space within the package. Further, this increased functionality often requires additional input/output contacts that cannot be provided along the perimeter of traditional small flat no-leads packages. In addition, the traditional techniques of forming the flat no-leads packages can be resource and time intensive due to repeated mechanical processes, such as performing wire bonding.

It is therefore desirable to provide a small, near chip scale package that can provide increased numbers of input/output contacts, while at the same time providing capacity for larger semiconductor devices in the same package footprint.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

A small form factor near chip scale package is provided that includes input/output contacts not only along the periphery of the package, but also along the package bottom area. Embodiments provide these additional contacts through use of an array lead frame coupled to under die signal contacts through the use of flip chip bonding techniques. The array lead frame contacts are electrically isolated through the use of a partial sawing process performed during package singulation.

Certain electronics applications have led to the demand for smaller and smaller semiconductor device packages. For some applications, flat no-leads packages on the order of 2 mm×2 mm or less are being suggested. These small package sizes result in a very limited region in which input/output contacts can be placed. Given pitch restrictions (currently of about 0.4 mm), only five input/output contacts can be placed along opposing sides of a 2 mm×2 mm DFN package. But some applications, while desirous of such small form factors, require more than the limited number of input/output contacts. Embodiments of the present invention provide a remedy to this issue.

Figure 1:
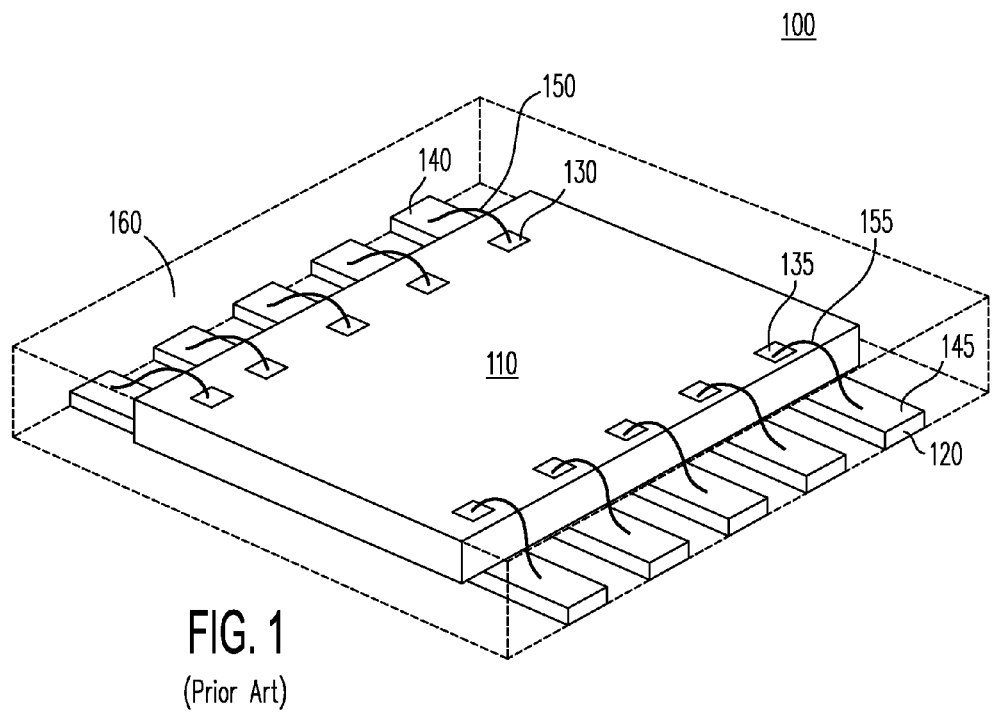
FIG. 1 is a simplified block diagram illustrating a perspective view of a conventional dual flat no leads (DFN) package.

FIG. 1 is a simplified block diagram illustrating a perspective view of a conventional dual flat no leads (DFN) package 100. A semiconductor device die 110 is mounted active side up on a die pad (not illustrated) of a lead frame 120. For purposes of this discussion, active side up refers to the major surface of semiconductor device die 110 having die bonding pads 130 and 135, for example, thereon. The die bonding pads on the active surface of semiconductor device die 110 (e.g., die bonding pads 130 and 135) are electrically coupled to corresponding leads (e.g., package leads 140 and 145) using corresponding wire bonds (e.g. wire bonds 150 and 155). Semiconductor device die 110, lead frame 120, and wire bonds 150 and 155 are encapsulated in a molding material 160. Upon singulation, the package leads are electrically isolated from one another and provide exposed contacts along sides of DFN package 100.

Figure 2:
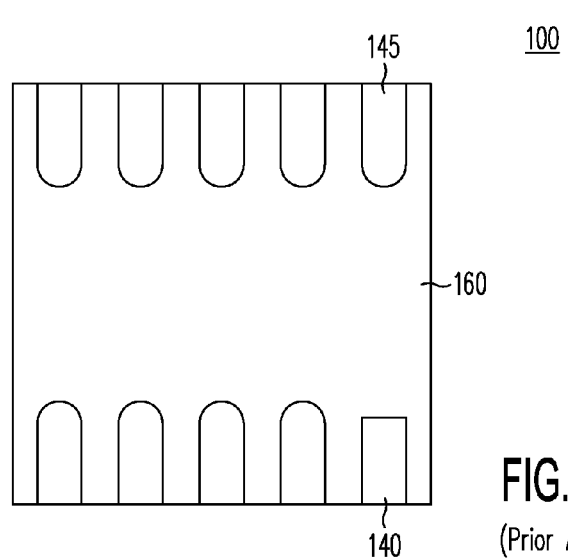
FIG. 2 is a simplified block diagram illustrating a bottom surface of the DFN package subsequent to singulation.

FIG. 2 is a simplified block diagram illustrating a bottom surface of DFN package 100 subsequent to singulation. Along the bottom surface of DFN package 100 are exposed package leads, including package leads 140 and 145. A molding material 160 forms the bulk of the bottom surface of DFN package 100. The package leads on the package bottom surface provide electrical connections between semiconductor device die 110 and electrical contacts formed on a printed circuit board on which the DFN package is mounted for operation.

Typically, a flat no-leads package such as DFN package 100 is electrically coupled to the printed circuit board using solder reflow techniques. Limitations of solder reflow techniques and techniques involved in manufacturing of printed circuit boards restrict how close package leads along the perimeter of the DFN package can be placed. A lead pitch of 0.4 mm (i.e., the distance from the top of one lead to the top of the neighboring lead) is the practical limitation of lead spacing on no-leads packages today. Thus, for a 2 mm×2 mm DFN package, five leads can be placed along lead bearing peripheral edges of the package, resulting in a maximum of 10 leads total on the package. For some applications and desired functionality, this is too few input/output contacts.

Figure 3:
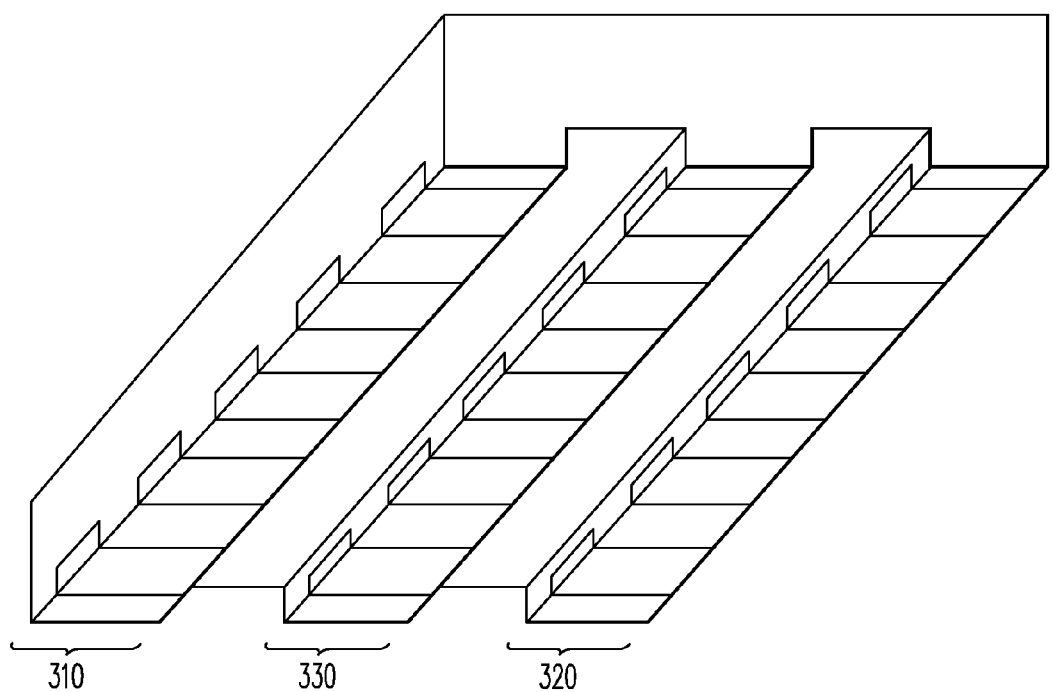
FIG. 3 is a simplified block diagram of a semiconductor device package and that provides additional input/output contacts in accord with embodiments of the present invention.

FIG. 3 is a simplified block diagram of a semiconductor device package 300 and that provides additional input/output contacts in accord with embodiments of the present invention. As illustrated, semiconductor device package 300 provides not only input/output contacts along opposite edges of a bottom surface of the package (e.g. 310 and 320) but also a set of center input/output contacts 330. The set of center input/output contacts 330 are provided in a region of the package beneath a location of a semiconductor device die within the encapsulated package. Center input/output contacts 330 increases the number of input/output contacts for semiconductor device package 300 by ½, while continuing to hold the area footprint of the semiconductor device package to the same area as a traditional DFN package (e.g., DFN package 100). As will be discussed more fully below, embodiments of the semiconductor device package 300 can be provided using an array lead frame to which a semiconductor device die is electrically coupled through the use of flip chip die attach techniques, rather than wire bonding.

Figure 4:
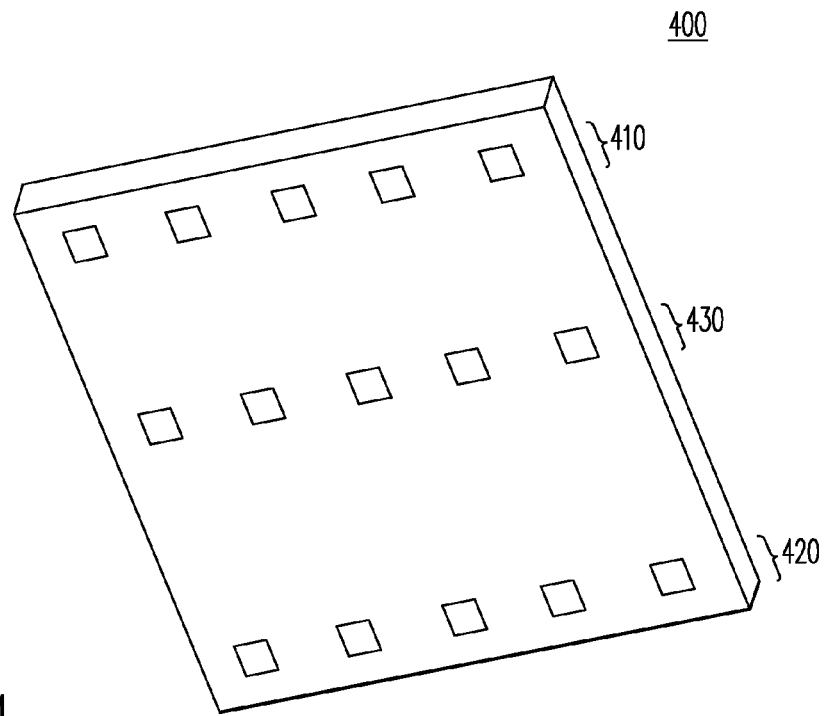
FIG. 4 is a simplified block diagram illustrating one embodiment of a semiconductor device die configured for use with embodiments of the present invention.

FIG. 4 is a simplified block diagram illustrating one embodiment of a semiconductor device die 400 configured for use with embodiments of the present invention. The active surface of semiconductor device die 400 includes three rows of bonding pads. Bonding pads rows 410 and 420 are provided along a perimeter edges of semiconductor device die 400, while bonding pad row 430 is provided in a center region of semiconductor device die 400. As will be made clearer below, locations of the bonding pads should correspond with lead locations for the array lead frame incorporated in the semiconductor device package. The composition of, and techniques for, providing the bonding pads on semiconductor device die 400 correspond to those commonly used in the art of semiconductor device die fabrication. Further, the bonding pads are metalized, or otherwise treated, to make the bonding pads more receptive to conductive bumps used for a flip chip assembly process.

Figure 5:
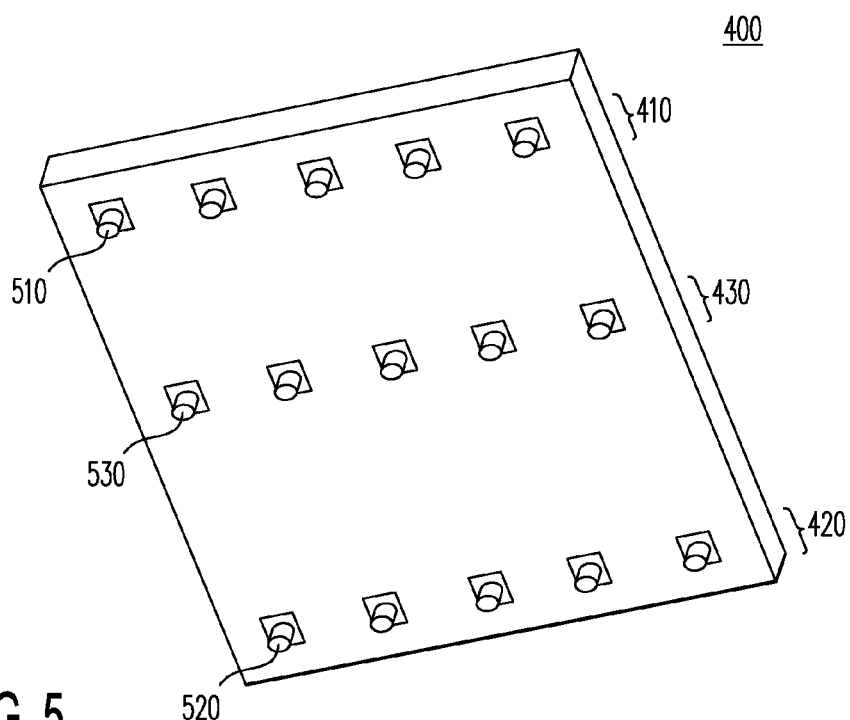
FIG. 5 is a simplified block diagram illustrating one embodiment of the semiconductor device die subsequent to formation of conductive bumps on the bonding pads of the active surface of the semiconductor device die.

FIG. 5 is a simplified block diagram illustrating one embodiment of semiconductor device die 400 subsequent to formation of conductive bumps on the bonding pads of the active surface of the semiconductor device die. As for a typical flip chip attachment process, conductive bumps are formed on each bonding pad of the semiconductor device die (e.g., conductive bumps 510, 520, and 530). Each bump provides a conductive path from a contact of semiconductor device die 400 to a lead frame to which the chip will be attached (as will be discussed in further detail below), as well as forming the mechanical mounting of the semiconductor device die to the lead frame. Embodiments of the present invention are not limited by the type of bumping process used, and therefore conductive bumps such as solder bumps formed by sputtering or plating, nickel-gold bumps formed by electroless nickel plating, gold stud bumps, conductive adhesive bumps, and the like can all be used. A preferred embodiment uses copper pillar bumps formed by a plating process, in which the copper pillar bumps have a solder cap. Copper pillar bumps are preferred in part because such a technique is well-suited to fine pitch applications, and uses existing bump infrastructures and standard materials and process flows and is therefore more easily and cost-effectively incorporated into the manufacturing process flow.

Figure 6:
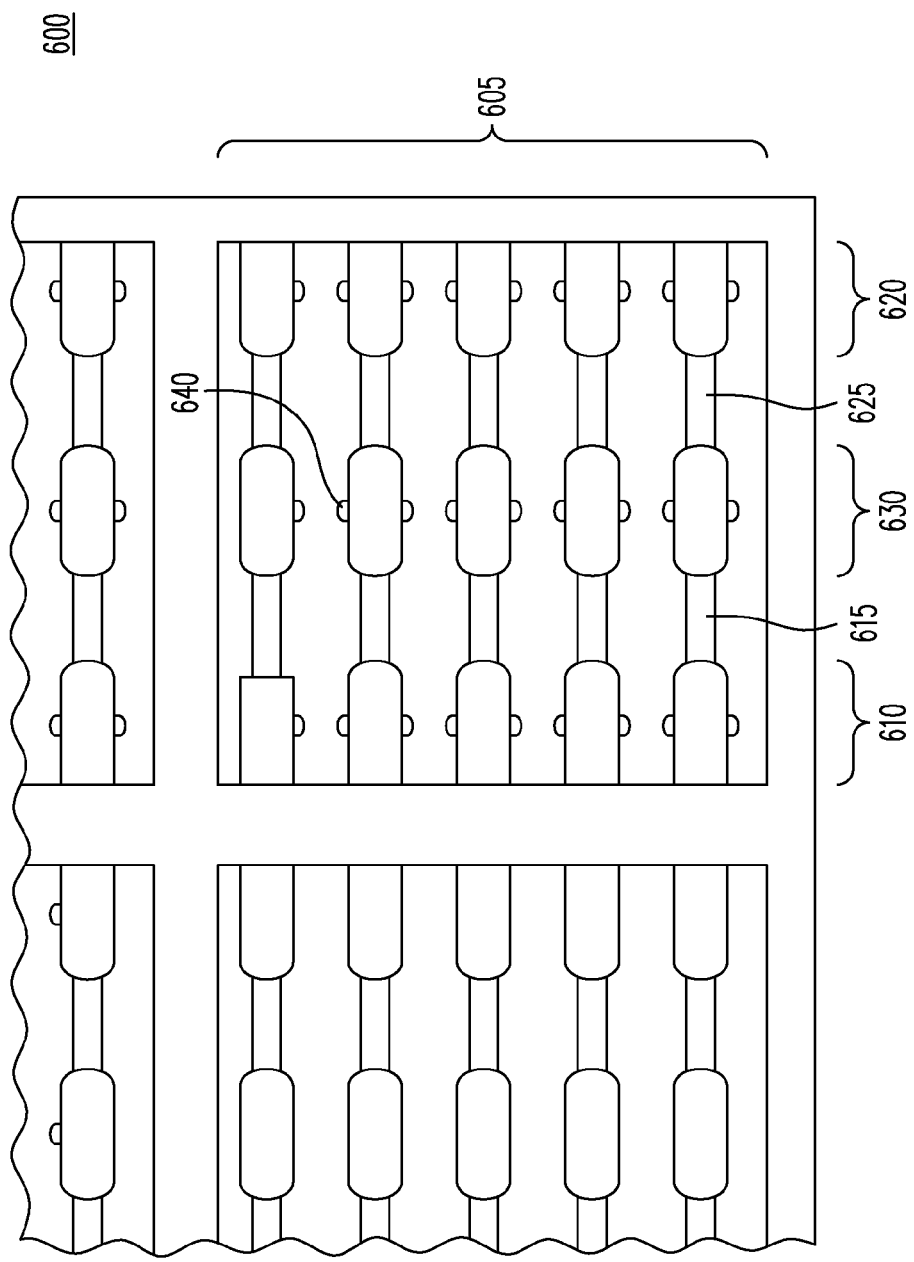
FIG. 6 is a simplified block diagram illustrating a portion of an example array lead frame strip usable for embodiments the present invention.

FIG. 6 is a simplified block diagram illustrating a portion of example array lead frame strip 600 usable for embodiments the present invention. Array lead frame strip portion 600 is part of a larger strip of array lead frames onto which many semiconductor device die can be placed. Each array lead frame unit 605 includes a number of leads corresponding to the number of semiconductor device die contacts (e.g., bonding pad rows 410, 420, and 430). As illustrated, edge lead sets 610 and 620 correspond to bond pad rows 410 and 420, respectively, of semiconductor device die 400. Likewise, center lead set 630 corresponds to center bond pad row 430. Edge leads 610 are coupled to center leads 630 by corresponding tie bars 615 and edge leads 620 are coupled to center leads 630 by corresponding tie bars 625.

Each lead provides a surface to which a corresponding conductive bump on semiconductor device die can be attached. Each lead also provide a separate surface that will be exposed external to a semiconductor device package subsequent to a molding and singulation process, as will be discussed in greater detail below. As illustrated, each lead also can incorporate a locking feature (e.g., locking feature 640) configured to aid in restricting movement of an associated lead within an encapsulant. Lead frames within array lead frame strip 600 are coupled to one another via strip tie bars 650. Array lead frame strip 600 can include as many array lead frame units 605 as desired for an application. In one embodiment, a strip that is 250 mm×70 mm can provide 2496 2 mm×2 mm array lead frame units.

Figure 7:
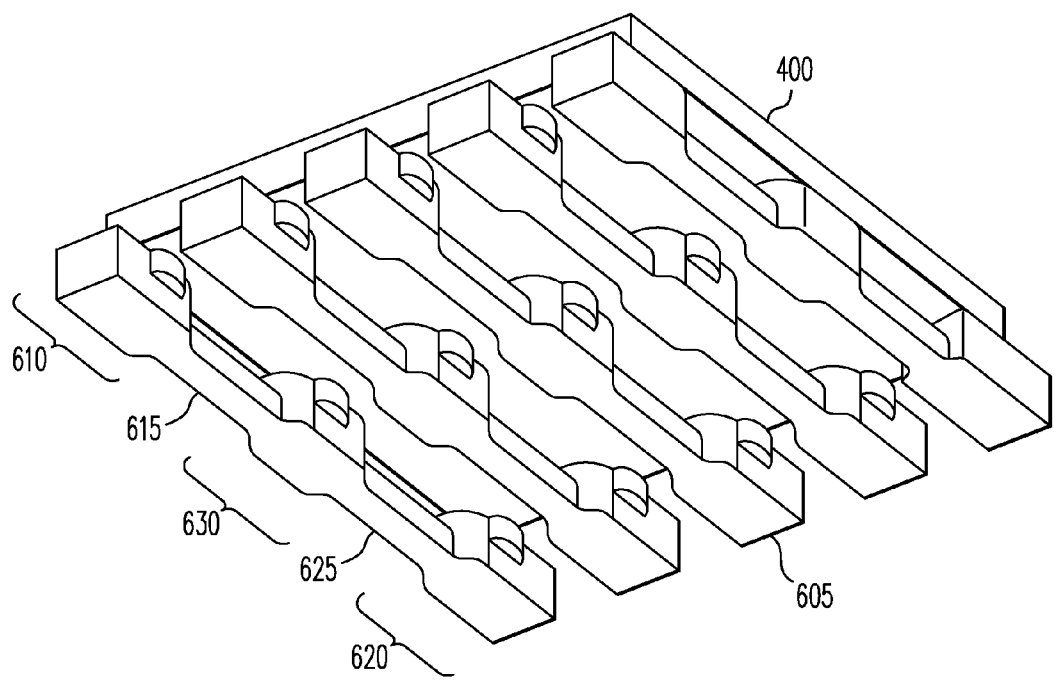
FIG. 7 is a simplified block diagram illustrating a perspective view of the semiconductor device die attached to an array lead frame unit subsequent to a flip chip die attach process.

FIG. 7 is a simplified block diagram illustrating a perspective view of semiconductor device die 400 attached to array lead frame unit 605 subsequent to a flip chip die attach process. Semiconductor device die 400 is placed on array lead frame unit 605, using a typical pick and place technique. As discussed above, bumps on bonding pad row 410 are coupled to edge lead set 610, bumps on bonding pad row 420 are coupled to edge lead set 620, and bumps on bonding pad row 630 are coupled to center lead set 630. A typical flip chip die attach process as known in the art can be used in which solder on the bumps (or forming the bumps) forms the attachment and the conductive path. In this manner, embodiments avoid the use of wire bonding techniques found in prior art flat no-leads packages. Since wire bonding is avoided, the semiconductor device die attached to the lead frame extends over the edge lead sets, and therefore can be larger in area than a semiconductor device die incorporated in a standard flat no-leads package.

Figure 8:
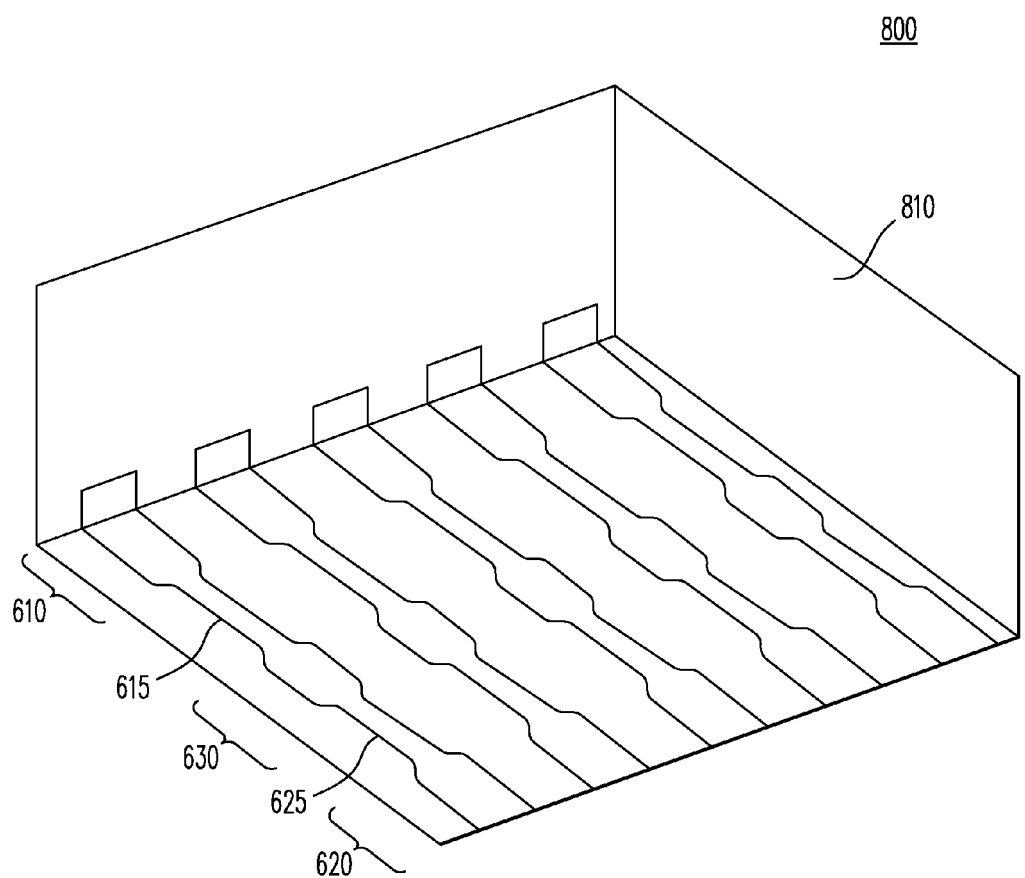
FIG. 8 is a simplified block diagram illustrating a perspective view of a semiconductor device structure at a step in processing subsequent to that illustrated in FIG. 7.

FIG. 8 is a simplified block diagram illustrating a perspective view of a semiconductor device structure 800 at a step in processing subsequent to that illustrated in FIG. 7. A molding material is applied to the semiconductor device die affixed to array lead frame strip 600, forming an encapsulant 810 that encapsulates the structures within the molding material and forms a panel. The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding and spin application. Once the molding material is applied, the panel can be cured by exposing the materials to certain temperatures for a period of time, or by applying curing agents, or both. In a typical encapsulation process, a depth of encapsulant 810 exceeds a maximum height of structures embedded in the molding material. Only a portion of a panel is illustrated I FIG. 8.

Figure 9:
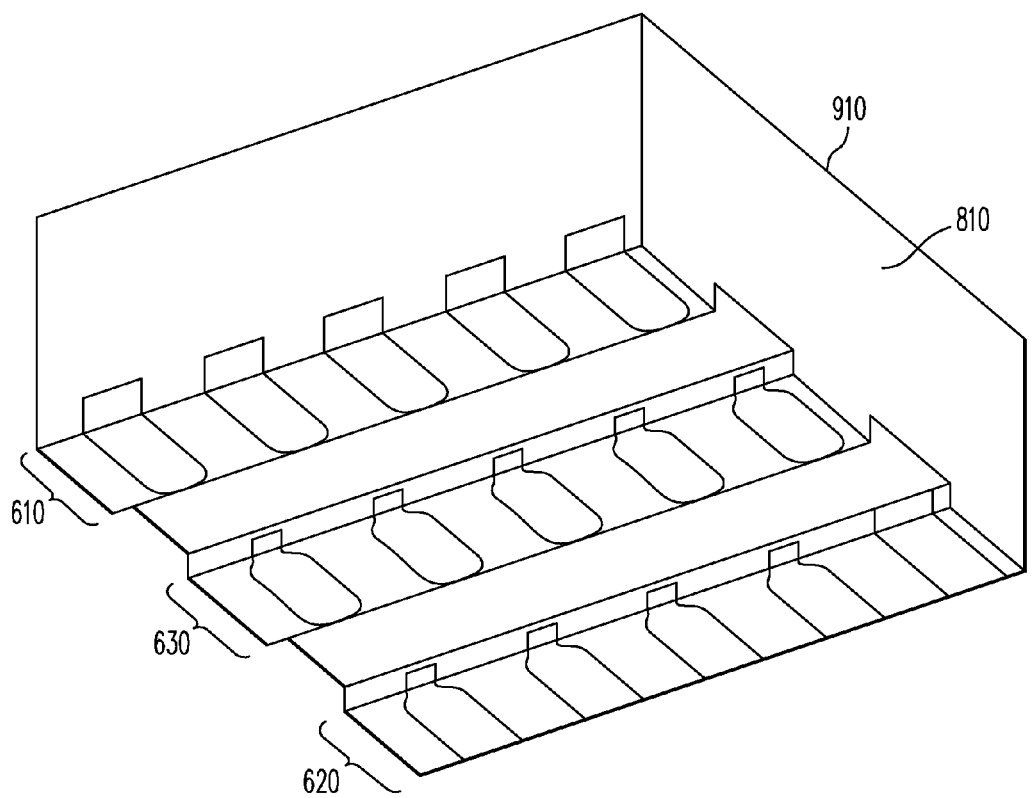
FIG. 9 is a simplified block diagram illustrating a perspective view of the semiconductor device structure after partial saw through and singulation, in accord with embodiments of the present invention.

FIG. 9 is a simplified block diagram illustrating a perspective view of semiconductor device structure 800 after partial saw through and singulation, in accord with embodiments of the present invention. Exposed edge leads 610 and 620 are isolated from center leads 630 by removing tie bars 615 and 625. In one embodiment, the tie bars are removed using a partial saw process that cuts through the tie bars and the encapsulant to a depth sufficient to remove all the tie bar material. The partial sawing can also provide cuts of a width sufficient to expose sides of the center leads while leaving sufficient center lead material to form good contacts with a printed circuit board to which the semiconductor device structure will be attached during use. In an alternative embodiment, the tie bars can be removed using a mask and etching process. One advantage of using a mask and etching process is that the etching can be selective to the mold material, and thus does not remove any molding material during the etching process. Once the tie bar material is removed, by either partial sawing or etching, individual semiconductor device package 910 can be singulated from the panel by performing a through cut sawing, thereby removing strip tie bars 650 and electrically isolating all the package leads. One advantage of using the partial sawing method to remove the tie bars is that such partial sawing can be performed during the same process step as singulation, thereby simplifying the process flow.

Figure 10:
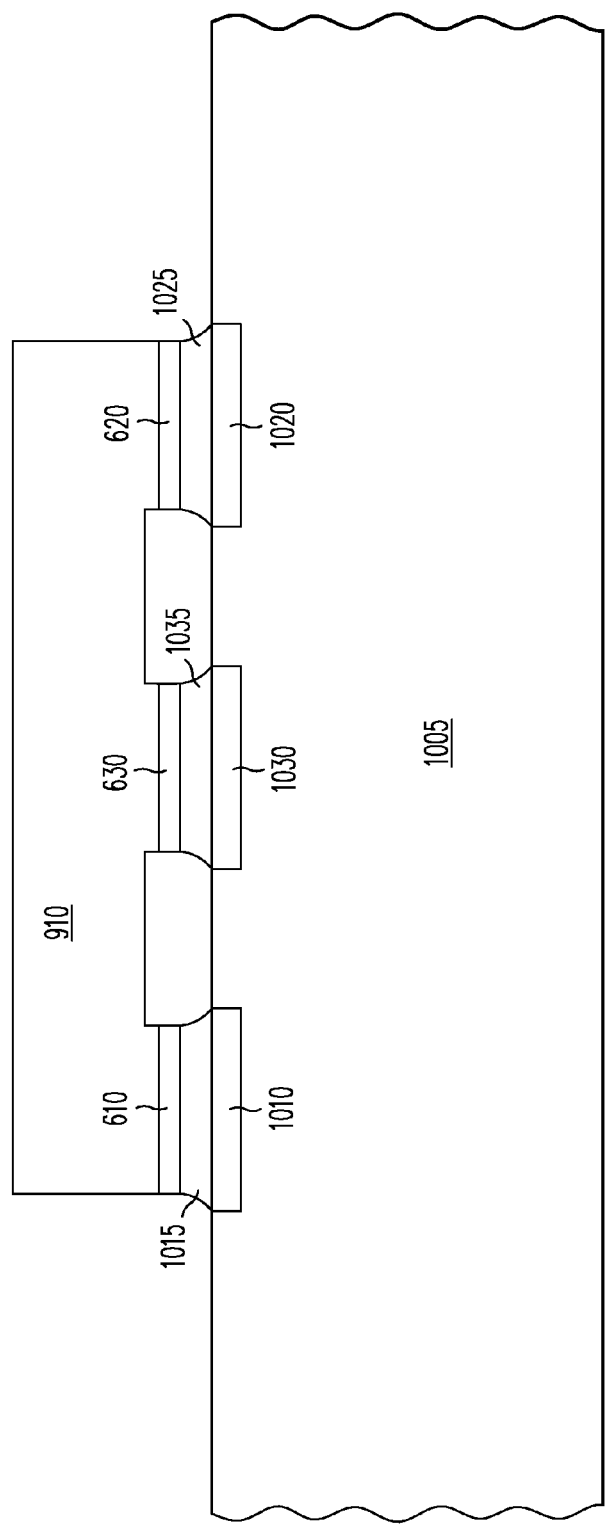
FIG. 10 is a simplified block diagram illustrating a cross section of a semiconductor device package electrically coupled to a printed circuit board (PCB).

FIG. 10 is a simplified block diagram illustrating a cross section of semiconductor device package 910 electrically coupled to a printed circuit board (PCB) 1005. PCB 1005 has electrical contacts 1010, 1020, and 1030 that correspond to edge leads 610 and 620, and center lead 630, respectively. The leads of semiconductor device package 910 are placed over the PCB contacts and can be electrically coupled to the PCB contacts using solder reflow techniques known in the art, for example.

As discussed above, embodiments of the present invention provide numerous advantages over standard near chip scale packages. Due to the small form factors being demanded, standard near chip scale packages are limited in the number of input/output contacts that can be provided along the perimeter of the package. The discussed embodiments provide at least an increase of 50% the number of leads by providing a row of leads along the center region of the semiconductor device package. This allows for increased input/output capacity of the packaged semiconductor device. In addition, by using flip chip attachment techniques to bond the semiconductor device die to the array lead frame, wire bonding is avoided. Thus, the size of the semiconductor device die can extend closer to the edges of the semiconductor device package, allowing for potentially increased functional capabilities of the semiconductor device. Further, the use of a batch attachment process such as flip chip over wire bonding allows for a simpler, faster, and potentially less expensive process flow for assembling the semiconductor device package.

By now it should be appreciated that there has been provided an array lead frame for a semiconductor device package, the array lead frame includes: a first row of a first plurality of edge leads; a second row of a second plurality of edge leads; a third row of a third plurality of center leads; a first set of tie bars coupling a center lead of the third plurality of center leads to one or more edge leads of the first plurality of edge leads; and, a second set of tie bars coupling the center lead of the third plurality of center leads to one or more edge leads of the second plurality of edge leads. Each lead is configured for electrical coupling to a corresponding die bonding pad using a flip chip die attach.

In one aspect of the above embodiment, a quantity of the first plurality of edge leads is the same as a quantity of the second plurality of edge leads. In a further aspect, a quantity of center leads is the same as the quantity of the first plurality of edge leads, the first set of tie bars includes one tie bar from the center lead to a corresponding edge lead of the first plurality of edge leads, and the second set of tie bars includes one tie bar from the center lead to a corresponding edge lead of the second plurality of edge leads.

Another embodiment provides a semiconductor device package that includes: an array lead frame having a first row of a first plurality of edge leads, a second row of a second plurality of edge leads, a third row of a third plurality of center leads, a first set of tie bars coupling a center lead to one or more edge leads of the first plurality of edge leads, and a second set of tie bars coupling the center lead to one or more edge leads of the second plurality of edge leads; a semiconductor device die; and a mold compound formed over and around the semiconductor device die and encapsulating a portion of each lead of the array lead frame. The semiconductor device die has a first major surface and a plurality of bond pads on the first major surface. Each bond pad is located in a geometric location corresponding to an edge lead or center lead of the array lead frame. Each bond pad is electrically coupled to the corresponding edge lead or center lead of the array lead frame.

In one aspect of the above embodiment, the semiconductor device die further includes a conductive bump formed on each bond pad. The electrical coupling of each bond pad to a corresponding edge lead or center lead is performed using the conductive bump for a flip chip die attach. In a further aspect, the conductive bump is one of a copper pillar bump, a solder bump, a stud, and a conductive adhesive bump.

In another aspect of the above embodiment, the semiconductor device package further includes the first plurality of edge leads being exposed along a first edge of the semiconductor device package on a first major surface of the semiconductor device package, the second plurality of edge leads exposed along a second edge of the semiconductor device package on the first major surface of the semiconductor device package where the second edge is opposite the first edge of the semiconductor device package, and the third plurality of center leads is exposed in a center region of the first major surface of the semiconductor device package. In another aspect of the above embodiment, the first plurality of edge leads, the second plurality of edge leads, and the third plurality of center leads are electrically isolated by removal of the first set of tie bars and the second set of tie bars subsequent to formation of the mold compound. In a further aspect, removal of the first set of tie bars and second set of tie bars is performed by a partial sawing operation.

Another embodiment of the present invention provides for a method of forming a semiconductor device package, where the method includes: providing an array lead frame having a plurality of leads; conductively attaching a semiconductor device die to the array lead frame; and, encapsulating the semiconductor device die and a portion of the array lead frame by forming a mold compound over and around the semiconductor device die and the portion of the array lead frame. The semiconductor device die includes a plurality of bonding pads on a major surface of the semiconductor device die. Each bonding pad has a corresponding lead of the plurality of leads. Conductively attaching comprises a flip chip die attach process.

One aspect of the above embodiment further includes partially sawing the semiconductor device package and singulating the semiconductor device package from a panel formed by said encapsulating. The partially sawing is performed subsequent to the encapsulating and removes a plurality of tie bars coupling pairs of the leads of the array lead frame such that the leads are rendered electrically isolated. In a further aspect, subsequent to partially sawing and singulating, the semiconductor device package includes a plurality of leads exposed along two or more perimeter edges of a major surface of the semiconductor device package and a plurality of leads exposed on a center region of the major surface of the semiconductor device package.

Another aspect of the above embodiment further includes forming a conductive bump on each bonding pad of the semiconductor device die. In a further aspect, the conductive bump includes one of a copper pillar bumps, a solder bump, a stud, and conductive adhesive. A still further aspect of the above embodiment includes placing the semiconductor device die on the array lead frame such that each conductive bump is in contact with a lead on the array lead frame.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, depending upon advances made in pitch size, additional input/output leads can be placed in any row of a semiconductor device package, and potentially multiple rows of connectors could be provided along the center area of a package. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An array lead frame for a semiconductor device package, the array lead frame comprising:
   a first row of a first plurality of edge leads;
   a second row of a second plurality of edge leads;
   a third row of a third plurality of center leads;
   a first set of tie bars coupling a center lead of the third plurality of center leads to one or more edge leads of the first plurality of edge leads; and
   a second set of tie bars coupling the center lead of the third plurality of center leads to one or more edge leads of the second plurality of edge leads,
   wherein
      each lead is configured for electrical coupling to a corresponding die bonding pad using a flip chip die attach.

2. The array lead frame of claim 1, wherein
   a quantity of the first plurality of edge leads is the same as a quantity of the second plurality of edge leads.

3. The array lead frame of claim 2, wherein
   a quantity of the third plurality of center leads is the same as the quantity of the first plurality of edge leads;
   the first set of tie bars comprises one tie bar from the center lead to a corresponding edge lead of the first plurality of edge leads; and
   the second set of tie bars comprises one tie bar from the center lead to a corresponding edge lead of the second plurality of edge leads.

4. A semiconductor device package comprising:
   an array lead frame comprising
      a first row of a first plurality of edge leads,
      a second row of a second plurality of edge leads,
      a third row of a third plurality of center leads,
      a first set of tie bars coupling a center lead of the third plurality of center leads to one or more edge leads of the first plurality of edge leads,
      a second set of tie bars coupling the center lead of the third plurality of center leads to one or more edge leads of the second plurality of edge leads;
   a semiconductor device die comprising a first major surface and a plurality of bond pads on the first major surface, wherein
      each bond pad is located in a geometric location corresponding to an edge lead or center lead of the array lead frame, and
      each bond pad is electrically coupled to the corresponding edge lead or center lead of the array lead frame; and
   a mold compound formed over and around the semiconductor device die and encapsulating a portion of each lead of the array lead frame.

5. The semiconductor device package of claim 4 wherein the semiconductor device die further comprises:
   a conductive bump formed on each bond pad, wherein said electrical coupling of each bond pad to a corresponding edge lead or center lead is performed using the conductive bump for a flip chip die attach.

6. The semiconductor device package of claim 5 wherein the conductive bump comprises one of a copper pillar bump, a solder bump, a stud, and a conductive adhesive bump.

7. The semiconductor device package of claim 4 further comprising:

the first plurality of edge leads exposed along a first edge of the semiconductor device package on a first major surface of the semiconductor device package;

the second plurality of edge leads exposed along a second edge of the semiconductor device package on the first major surface of the semiconductor device package, wherein the second edge is opposite the first edge of the semiconductor device package; and the third plurality of center leads exposed in a center region of the first major surface of the semiconductor device package.

8. The semiconductor device package of claim 4 wherein the first plurality of edge leads, the second plurality of edge leads, and the third plurality of center leads are electrically isolated by removal of the first set of tie bars and the second set of tie bars subsequent to formation of the mold compound.

9. The semiconductor device package of claim 8 wherein said removal of the first set of tie bars and the second set of tie bars is performed by a partial sawing operation.

* * * * *